(12) United States Patent
Aoki et al.

(10) Patent No.: US 10,537,043 B2
(45) Date of Patent: Jan. 14, 2020

(54) ELECTRONIC APPARATUS

(71) Applicant: FUJITSU LIMITED, Kawasaki-shi, Kanagawa (JP)

(72) Inventors: Michimasa Aoki, Kawasaki (JP); Yosuke Tsunoda, Tachikawa (JP); Keizou Takemura, Kawasaki (JP); Kenji Katsumata, Odawara (JP); Masumi Suzuki, Kawasaki (JP); Jie Wei, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/000,949

(22) Filed: Jun. 6, 2018

(65) Prior Publication Data

US 2018/0359879 A1 Dec. 13, 2018

(30) Foreign Application Priority Data

Jun. 9, 2017 (JP) .................... 2017-114758

(51) Int. Cl.
*H05K 7/20* (2006.01)
*G06F 1/20* (2006.01)
*H01L 23/467* (2006.01)
*H01L 23/427* (2006.01)
*G06F 1/18* (2006.01)

(52) U.S. Cl.
CPC ......... *H05K 7/20409* (2013.01); *G06F 1/182* (2013.01); *G06F 1/20* (2013.01); *H01L 23/427* (2013.01); *H01L 23/467* (2013.01); *H05K 7/20127* (2013.01); *H05K 7/20336* (2013.01); *H05K 7/20418* (2013.01)

(58) Field of Classification Search
CPC ... G06F 1/20; H05K 7/20127; H05K 7/20409
See application file for complete search history.

(56) References Cited

U.S. PATENT DOCUMENTS

| 5,424,913 | A * | 6/1995 | Swindler | ................. | G06F 1/203 |
| | | | | | 361/679.47 |
| 6,504,719 | B2 * | 1/2003 | Konstad | .................... | F28F 3/12 |
| | | | | | 165/104.32 |
| 7,177,154 | B2 * | 2/2007 | Lee | ......................... | G06F 1/181 |
| | | | | | 165/104.33 |
| 7,277,286 | B2 * | 10/2007 | Lee | ......................... | G06F 1/20 |
| | | | | | 174/15.2 |
| 7,474,527 | B2 * | 1/2009 | Wu | .......................... | G06F 1/20 |
| | | | | | 165/104.33 |
| 7,724,526 | B2 * | 5/2010 | Hinze | ................... | H01L 23/367 |
| | | | | | 165/104.33 |
| 8,059,401 | B2 * | 11/2011 | Guan | .................. | H01L 23/3675 |
| | | | | | 361/679.54 |
| 8,472,184 | B2 * | 6/2013 | Chang | ................ | H05K 7/20418 |
| | | | | | 165/104.21 |

(Continued)

FOREIGN PATENT DOCUMENTS

JP 2003-106560 4/2003

*Primary Examiner* — Robert J Hoffberg
(74) *Attorney, Agent, or Firm* — Fujitsu Patent Center

(57) ABSTRACT

An electronic apparatus includes a case, an electronic part housed in the case, and a heat sink coupled to the electronic part and at least partially arranged outside a side wall of the case with a gap formed between an outer peripheral portion of the heat sink and the side wall of the case.

19 Claims, 9 Drawing Sheets

(56) References Cited

U.S. PATENT DOCUMENTS

| | | | | |
|---|---|---|---|---|
| 8,929,078 B2* | 1/2015 | Weeber | ............... | H01L 23/552 |
| | | | | 165/80.3 |
| 10,076,063 B2* | 9/2018 | Matsuda | ............ | H05K 7/20445 |
| 2016/0044824 A1* | 2/2016 | North | ........................ | G06F 1/20 |
| | | | | 361/679.47 |

* cited by examiner

ELECTRONIC APPARATUS

CROSS-REFERENCE TO RELATED APPLICATION

This application is based upon and claims the benefit of priority of the prior Japanese Patent Application No. 2017-114758, filed on Jun. 9, 2017, the entire contents of which are incorporated herein by reference.

FIELD

The embodiments discussed herein are related to an electronic apparatus.

BACKGROUND

There is an electronic apparatus including a case, an electronic part housed in the case, and a heat sink connected to the electronic part. In this electronic apparatus, heat of the electronic part is dissipated via the heat sink. The electronic part is thereby cooled.

However, there is room for making further improvements to improve heat dissipation efficiency of the heat sink.

The following is a reference document.
[Document 1] Japanese Laid-open Patent Publication No. 2003-106560.

SUMMARY

According to an aspect of the invention, an electronic apparatus includes a case, an electronic part housed in the case, and a heat sink coupled to the electronic part and at least partially arranged outside a side wall of the case with a gap formed between an outer peripheral portion of the heat sink and the side wall of the case.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
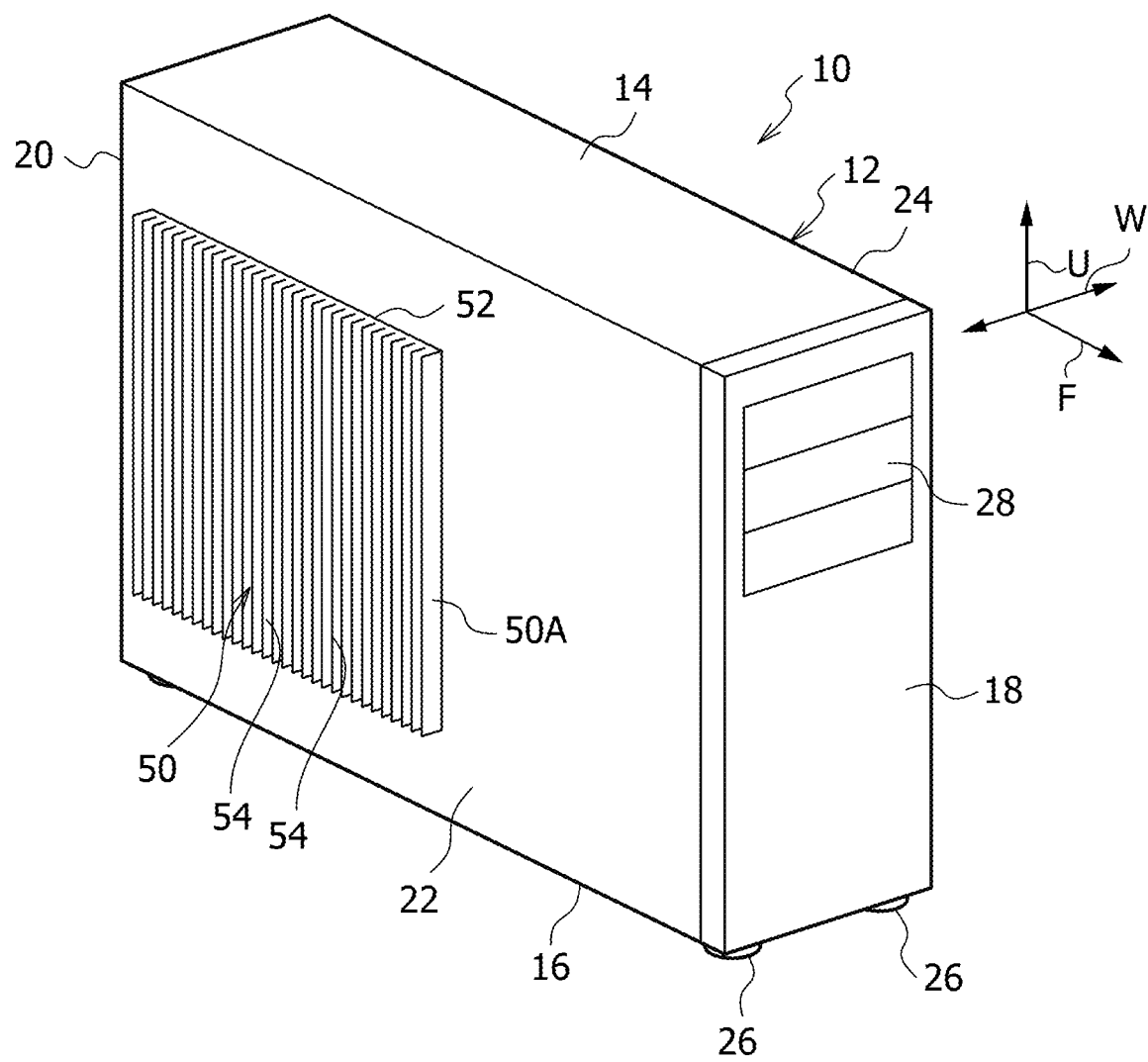
FIG. 1 is a perspective view of an electronic apparatus according to a first embodiment as viewed from the front side.
Figure 2:
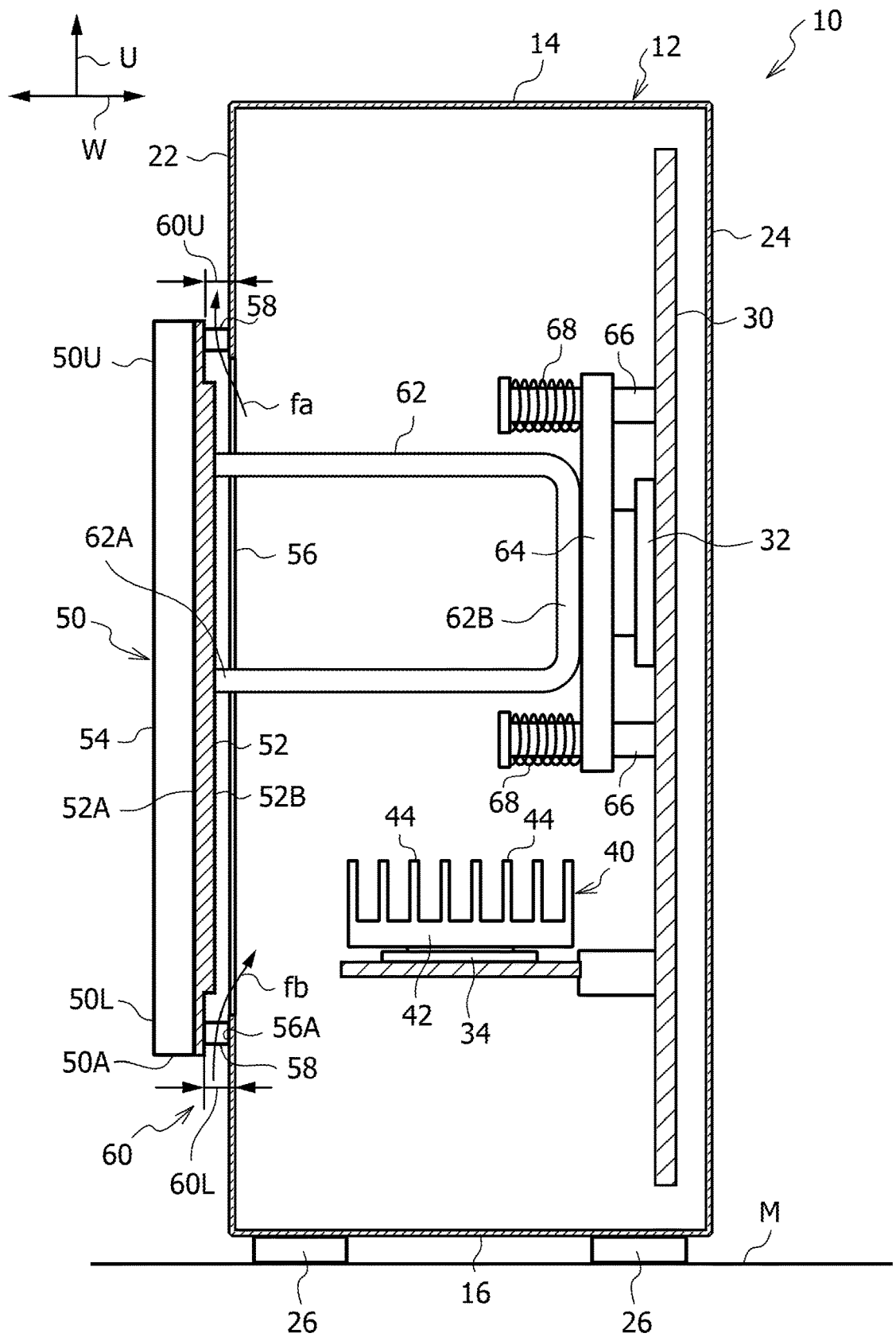
FIG. 2 is a cross-sectional view taken along II-II line in FIG. 3.

[First Embodiment]
A first embodiment is described first.
[Electronic Apparatus]
As illustrated in FIG. 1, an electronic apparatus 10 according to the embodiment is assumed to be, for example, a desktop or tower type information processing apparatus which is used as a server or a workstation. As illustrated in FIG. 2, the electronic apparatus 10 includes a case 12, a circuit board 30, an internal heat sink 40, an external heat sink 50, and a heat pipe 62.

[Case]
As illustrated in FIG. 1, the case 12 is formed in a rectangular solid shape. Note that the arrow U illustrated as appropriate in each drawing indicates the upper side in the height direction of the case 12 (electronic apparatus 10). Moreover, the arrow F indicates the front side (front face side) in the length direction of the case 12 (electronic apparatus 10). Furthermore, the arrow W indicates the width direction of the case 12 (electronic apparatus 10).

A plan shape of the case 12 is formed in a rectangular shape in which the length direction (arrow F direction) of the case 12 is the longitudinal direction. The case 12 has an upper wall 14, a lower wall 16, a front wall 18, a rear wall 20, and paired side walls 22, 24.

As illustrated in FIG. 2, the upper wall 14 and the lower wall 16 are opposite to each other in the height direction (arrow U direction) of the case 12. Moreover, legs 26 are provided at respective corners of a lower surface of the lower wall 16. The legs 26 protrude downward from the lower surface of the lower wall 16 and are mounted on a mounting surface M of a desk or the like. These legs 26 allow the case 12 to be mounted on the mounting surface M with a gap formed between the lower wall 16 and the mounting surface M.

As illustrated in FIG. 1, the front wall 18 and the rear wall 20 are arranged opposite to each other in the length direction of the case 12. For example, an expansion device 28 (see FIG. 1) such as an optical drive is mounted in the front wall 18. Moreover, the paired side walls 22, 24 are opposite to each other in the width direction (arrow W direction) of the case 12. An opening 56 (see FIG. 2) to be described later is formed in the side wall 22 which is one of the paired side walls 22, 24. Moreover, the external heat sink 50 to be described later is arranged outside the side wall 22. As illustrated in FIG. 2, the circuit board 30 is housed in the case 12.

[Circuit Board]
The circuit board 30 is formed in, for example, a rectangular plate shape. The circuit board 30 is housed in the case 12 in a standing position. Moreover, the circuit board 30 is arranged along an inner surface of the side wall 24 which is the other one of the paired side walls 22, 24. The circuit board 30 is fixed to the case 12 by using, for example, not-illustrated fixation members such as screws.

A first electronic part 32 and a second electronic part 34 are mounted on a surface of the circuit board 30 on the side wall 22 side. The first electronic part 32 is assumed to be, for example, a central processing unit (CPU). The first electronic part 32 generates heat as it consumes electric power. The first electronic part 32 is cooled by the external heat sink 50 to be described later. The second electronic part 34 is arranged below the first electronic part 32.

The second electronic part 34 is, for example, a video card, an input-output card, a memory, or the like. The second electronic part 34 generates heat as it consumes electric power. The second electronic part 34 is cooled by the internal heat sink 40.

[Internal Heat Sink]

The internal heat sink 40 is housed in the case 12. The internal heat sink 40 is made of, for example, a metal material with high thermal conductivity such as aluminum or copper. The internal heat sink 40 is connected to the second electronic part 34 so as to be capable of exchanging heat therewith. The heat of the second electronic part 34 is thereby dissipated into the case 12 via the internal heat sink 40. As a result, the second electronic part 34 is cooled.

Note that a natural air-cooled heat sink is assumed to be an example of the internal heat sink 40 in the embodiment, instead of a forced air-cooled heat sink which is cooled by a cooling fan or a like.

The internal heat sink 40 includes a base plate 42 and multiple heat dissipation fins 44. The base plate 42 is formed in a rectangular plate shape. Moreover, the base plate 42 is placed on the second electronic part 34. The multiple heat dissipation fins 44 are provided on the base plate 42.

The multiple heat dissipation fins 44 extend from the base plate 42 in a direction away from the second electronic part 34. The heat of the second electronic part 34 is dissipated into the case 12 via the heat dissipation fins 44. The second electronic part 34 is thereby cooled. Note that the internal heat sink 40 may be connected to at least one of the first electronic part 32 and the second electronic part 34.

[External Heat Sink]

The external heat sink 50 is arranged outside the side wall 22 of the case 12. The external heat sink 50 is made of, for example, a metal material with high thermal conductivity such as aluminum or copper. The external heat sink 50 is connected to the first electronic part 32 via the heat pipe 62 to be described later so as to be capable of exchanging heat therewith. The heat of the first electronic part 32 is thereby dissipated to the outside of the case 12 via the external heat sink 50. As a result, the first electronic part 32 is cooled.

Note that a natural air-cooled heat sink is assumed to be an example of the external heat sink 50 in the embodiment, instead of a forced air-cooled heat sink which is cooled by a cooling fan or a like. Moreover, the external heat sink 50 is an example of a heat sink.

Figure 3:
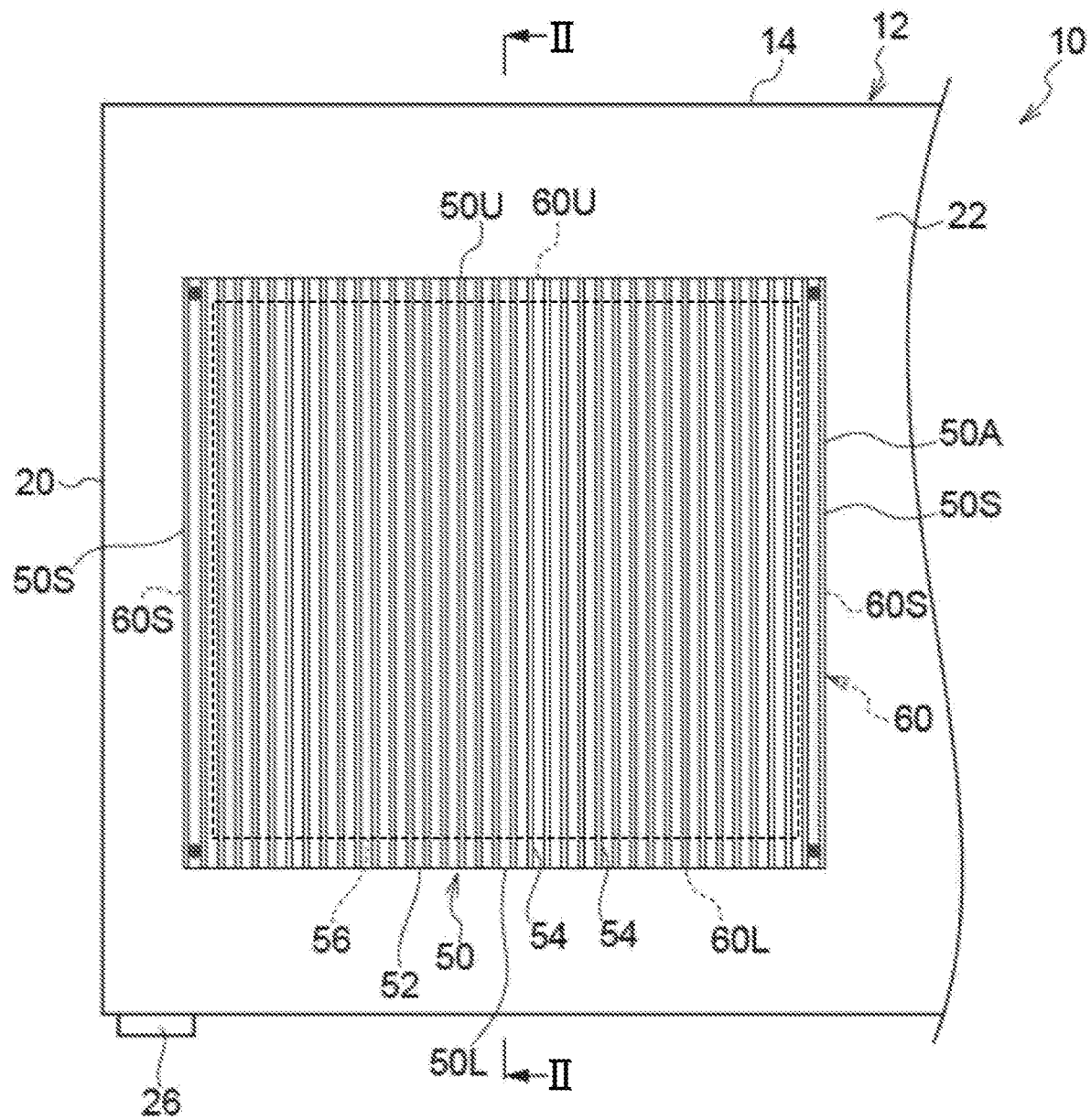
FIG. 3 is a side view of the electronic apparatus illustrated in FIG. 1.

The external heat sink 50 includes a base plate 52 and multiple heat dissipation fins 54. As illustrated in FIG. 3, the base plate 52 is formed in a rectangular plate shape. The base plate 52 is arranged outside the side wall 22 of the case 12. Moreover, the base plate 52 is arranged along an outer surface of the side wall 22. The base plate 52 faces the outer surface of the side wall 22.

The opening 56 is formed in the side wall 22. The opening 56 is formed in a rectangular shape. The opening 56 faces the first electronic part 32. Moreover, the base plate 52 covers the opening 56 from the outside of the side wall 22 of the case 12. More specifically, the external heat sink 50 entirely covers the opening 56 from the outside of the side wall 22 of the case 12.

Multiple spacer members 58 are arranged between an outer peripheral portion 50A of the external heat sink 50 and the side wall 22 of the case 12. The spacer members 58 are formed in, for example, cylindrical shapes. The spacer members 58 are arranged with their axial directions coinciding with the direction in which the external heat sink 50 and the side wall 22 of the case 12 face each other.

Not-illustrated screws which penetrate an outer peripheral portion of the base plate 52 are inserted in the spacer members 58. The screws are fastened to an outer surrounding portion 56A of the opening 56 in the side wall 22 of the case 12. The external heat sink 50 is thereby fixed to the side wall 22 of the case 12 with gaps 60 formed between the outer peripheral portion 50A of the external heat sink 50 and the outer surrounding portion 56A of the opening 56.

As illustrated in FIG. 3, the gaps 60 are each formed between a corresponding pair of adjacent spacer members 58 and are formed almost over the entire outer peripheral portion 50A of the external heat sink 50. More specifically, the gaps 60 are formed respectively along an upper end portion 50U, a lower end portion 50L, and left and right end portions 50S of the external heat sink 50. Outside air is supplied from the gaps 60 into the case 12 via the opening 56. Moreover, inside air in the case 12 is exhausted from the opening 56 to the outside of the case 12 through the gaps 60.

Note that, in the following description, the gap 60 along the upper end portion 50U of the external heat sink 50 is referred to as an upper gap 60U. Moreover, the gap 60 along the lower end portion 50L of the external heat sink 50 is referred to as a lower gap 60L. Furthermore, the gaps 60 along the left and right end portions 50S of the external heat sink 50 are referred to as vertical gaps 60S.

As illustrated in FIG. 2, the multiple heat dissipation fins 54 are provided on an outer surface 52A of the base plate 52. The multiple heat dissipation fins 54 extend from the base plate 52 toward the outside of the side wall 22 of the case 12. The multiple heat dissipation fins 54 also extend in the height direction of the case 12. The heat of the first electronic part 32 is dissipated to the outside of the case 12 via the heat dissipation fins 54.

The external heat sink 50 is connected to the first electronic part 32 via the heat pipe 62 to be capable of exchanging heat therewith. The heat pipe 62 is formed in a U-shape with ends on the external heat sink 50 side being open. The heat pipe 62 includes paired arm portions 62A and a connection portion 62B connecting the paired arm portions 62A to each other.

One end portions of the paired arm portions 62A are connected to an inner surface 52B of the base plate 52 to be capable of exchanging heat therewith. Note that the inner surface 52B of the base plate 52 is an example of an inner surface of the external heat sink 50. The other end portions of the paired arm portions 62A are connected to each other by the connection portion 62B. The connection portion 62B is joined to a spreader (heat spreader) 64.

The spreader 64 is formed in a rectangular plate shape. The spreader 64 is made of, for example, a metal material with high thermal conductivity such as aluminum or copper. The spreader 64 is placed on the first electronic part 32 to be capable of exchanging heat with the first electronic part 32.

An outer peripheral portion of the spreader 64 is fixed to the circuit board 30 via multiple supporting columns 66. The external heat sink 50 is thereby supported on the case 12 via the heat pipe 62, the spreader 64, and the circuit board 30.

Moreover, elastic bodies 68 such as coil springs are provided on the supporting columns 66. The elastic bodies 68 bias the spreader 64 toward the first electronic part 32. The spreader 64 is brought into pressure contact with the first electronic part 32 by the biasing force of the elastic bodies 68. Note that the connection structure between the heat pipe 62 and the first electronic part 32 may be changed as appropriate.

[Operations]

Next, operations of the first embodiment are described.

As illustrated in FIG. 2, the first electronic part 32 is housed in the case 12 of the electronic apparatus 10. The external heat sink 50 is connected to the first electronic part 32 via the spreader 64 and the heat pipe 62. The heat of the first electronic part 32 is thereby transmitted to the external heat sink 50 via the spreader 64 and the heat pipe 62.

The external heat sink 50 is arranged outside the side wall 22 of the case 12. Hence, the heat of the first electronic part 32 transmitted to the external heat sink 50 is dissipated to the outside of the case 12 from the multiple heat dissipation fins 54. Accordingly, in the embodiment, it is possible to improve the heat dissipation efficiency of the external heat sink 50 compared to the case where the external heat sink 50 is housed in the case 12. In other words, in the embodiment, it is possible to improve the cooling efficiency of the first electronic part 32.

Moreover, for example, if the external heat sink 50 is housed in the case 12, the size of the external heat sink 50 is limited by the size of the case 12 or the parts housed in the case 12.

Meanwhile, in the embodiment, the external heat sink 50 is arranged outside the case 12. Accordingly, it is possible to increase the size of the external heat sink 50. Hence, in the embodiment, it is possible to further improve the heat dissipation efficiency of the external heat sink 50. Moreover, in the embodiment, it is possible to make a housing space for the housed parts and the like in the case 12 larger than that in the case where the external heat sink 50 is housed in the case 12.

Moreover, the external heat sink 50 is connected to the first electronic part 32 via the heat pipe 62. Hence, it is possible to improve the heat exchange efficiency between the first electronic part 32 and the external heat sink 50. Accordingly, the cooling efficiency of the first electronic part 32 is improved.

Furthermore, the heat dissipation fins 54 of the external heat sink 50 extend in the height direction (arrow U direction) of the case 12. This facilitates rising of the outside air outside the case 12 which is heated by the heat dissipation fins 54, along the heat dissipation fins 54. Accordingly, in the embodiment, it is possible to improve the heat dissipation efficiency of the external heat sink 50 compared to, for example, the case where the heat dissipation fins 54 of the external heat sink 50 extend in the length direction of the case 12.

Furthermore, the gaps 60 are formed between the outer peripheral portion 50A of the external heat sink 50 and the outer surrounding portion 56A of the opening 56. More specifically, the upper gap 60U is formed on the upper end portion 50U side of the external heat sink 50, the lower gap 60L is formed on the lower end portion 50L side of the external heat sink 50, and the vertical gaps 60S (see FIG. 4) are formed on the left and right end portion 50S sides of the external heat sink 50.

As a result, air flows as follows when the inside air in the case 12 is heated by the heat of the first electronic part 32, the second electronic part 34, and the like. Specifically, as illustrated in FIG. 2, inside air fa in the case 12 rises and is exhausted from the opening 56 to the outside of the case 12 via the upper gap 60U. Moreover, outside air fb outside the case 12 is supplied from the lower gap 60L to the inside of the case 12 via the opening 56. In other words, the inside air in the case 12 is ventilated. This improves the cooling efficiency of the first electronic part 32, the second electronic part 34, and the like. Note that, although illustration is omitted, the inside air in the case 12 is also ventilated via the vertical gaps 60S.

Figure 5:
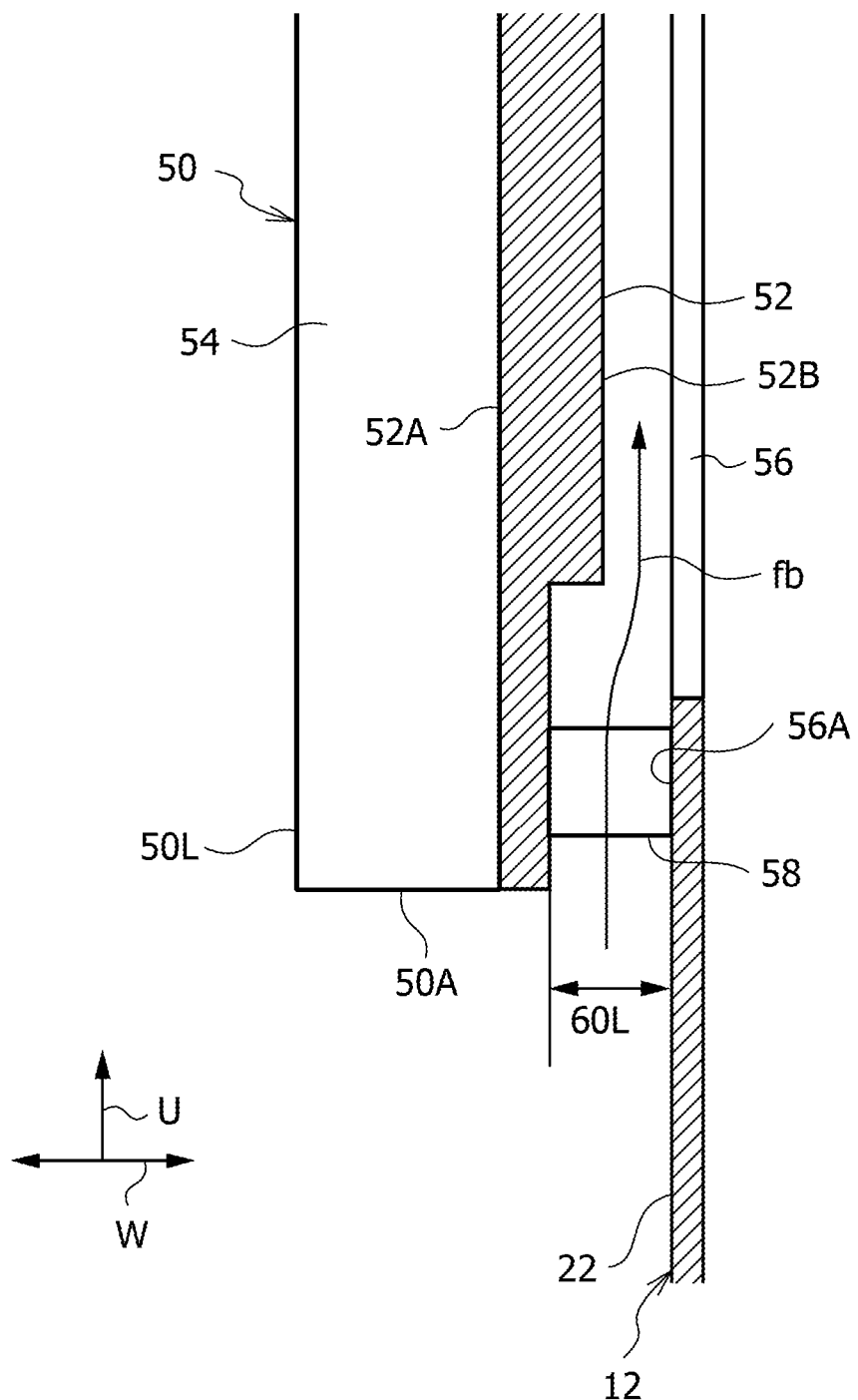
FIG. 5 is a partially enlarged cross-sectional view of FIG. 2.

Moreover, as illustrated in FIG. 5, the outside air fb supplied from the lower gap 60L to the inside of the case 12 via the opening 56 flows along a portion of the inner surface 52B on the lower end portion 50L side of the external heat sink 50. This outside air fb improves the heat dissipation efficiency of the external heat sink 50. Specifically, the outside air fb flowing along the portion of the inner surface 52B on the lower end portion 50L side of the external heat sink 50 cools the external heat sink 50.

Similarly, the inside air fa (see FIG. 2) in the case 12 to be exhausted from the opening 56 to the outside of the case 12 via the upper gap 60U flows along a portion of the inner surface 52B on the upper end portion 50U side of the external heat sink 50. This inside air fa improves the heat dissipation efficiency of the external heat sink 50.

Figure 4:
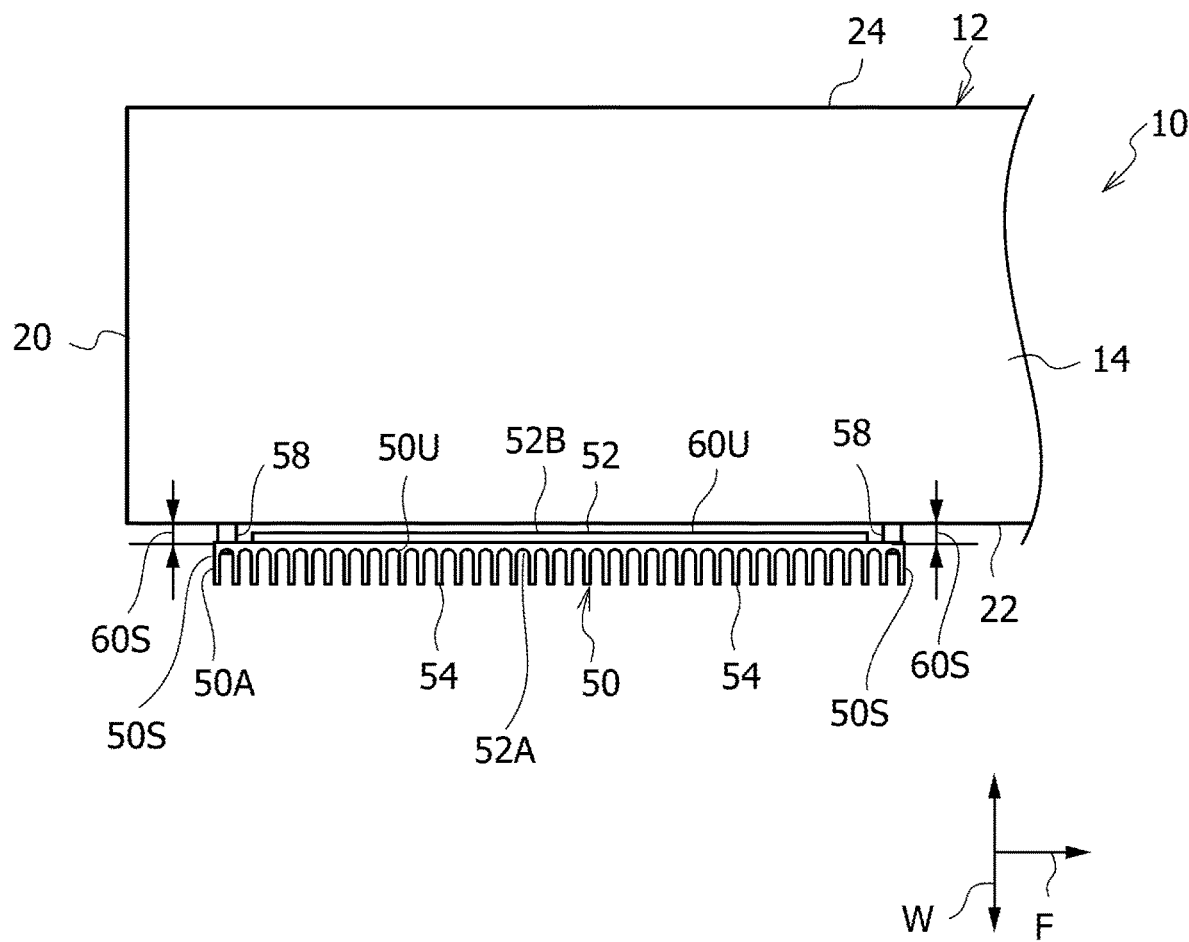
FIG. 4 is a top view of the electronic apparatus illustrated in FIG. 1.

As described above, the inside air in the case 12 is also ventilated via the vertical gaps 60S (see FIG. 4). In this case, the inside air in the case 12 or the outside air outside the case 12 flows along portions of the inner surface 52B on the left and right end portion 50S sides of the external heat sink 50. This inside air or the outside air improves the heat dissipation efficiency of the external heat sink 50.

Furthermore, the upper gap 60U, the lower gap 60L, and the vertical gaps 60S suppress transmission of heat from the external heat sink 50 to the side walls 22, 24 of the case 12. Accordingly, it is possible to suppress temperature rise of the case 12.

Moreover, the internal heat sink 40 is connected to the second electronic part 34. The internal heat sink 40 is housed in the case 12 and dissipates the heat of the second electronic part 34 to the inside of the case 12. The internal heat sink 40 is cooled by the outside air fb supplied from the lower gap 60L to the inside of the case 12 via the opening 56. This improves the cooling efficiency of the second electronic part 34.

[Second Embodiment]

Next, a second embodiment is described. In the second embodiment, members with the same configurations as those in the first embodiment are denoted by the same reference numerals and description thereof is omitted as appropriate.

Figure 6:
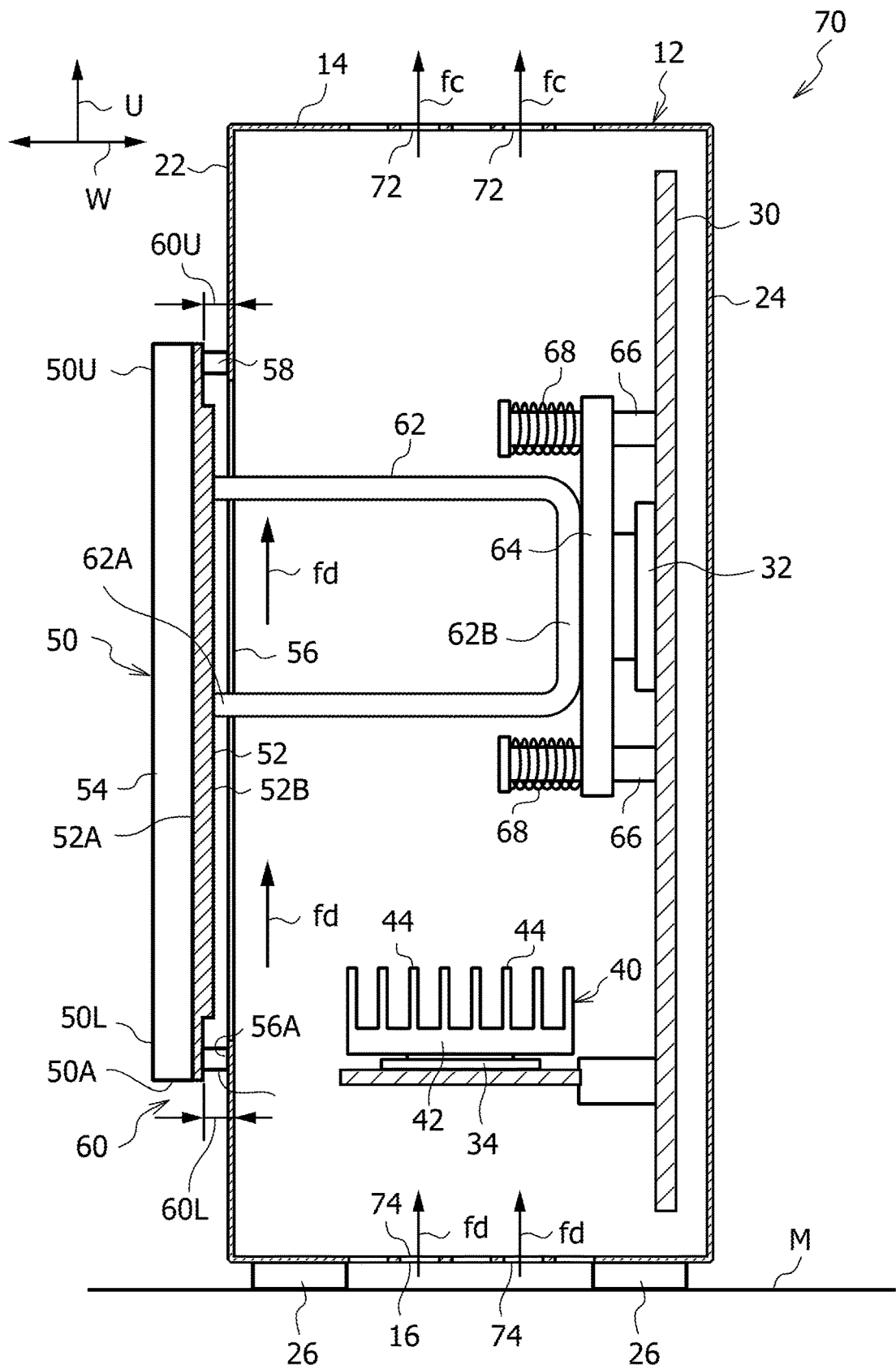
FIG. 6 is a cross-sectional view corresponding to FIG. 2 and illustrating an electronic apparatus according to a second embodiment.

As illustrated in FIG. 6, an electronic apparatus 70 according to the second embodiment includes the case 12. Upper ventilation openings 72 are formed in the upper wall 14 of the case 12. The upper ventilation openings 72 are, for example, multiple through holes or slits formed in the upper wall 14 of the case 12. Inside air fc in the case 12 is exhausted to the outside of the case 12 via the upper ventilation openings 72.

Moreover, lower ventilation openings 74 are formed in the lower wall 16 of the case 12. The lower ventilation openings 74 are, for example, multiple through holes or slits formed in the lower wall 16 of the case 12. In addition, as described above, the multiple legs 26 are provided on the lower wall 16 of the case 12. These legs 26 form a gap between the lower wall 16 of the case 12 and the mounting surface M. Outside air fd outside the case 12 is thereby supplied to the inside of the case 12 via the lower ventilation openings 74.

[Operations]

Next, operations of the second embodiment are described.

As illustrated in FIG. 6, in the electronic apparatus 70 according to the embodiment, the upper ventilation openings 72 are formed in the upper wall 14 of the case 12. Moreover, the lower ventilation openings 74 are formed in the lower wall 16 of the case 12.

As a result, air flows as follows when the inside air in the case 12 is heated by the heat of the first electronic part 32, the second electronic part 34, and the like. Specifically, the inside air fc in the case 12 rises and is exhausted from the upper ventilation openings 72 to the outside of the case 12. Moreover, the outside air fd outside the case 12 is supplied from the lower ventilation openings 74 to the inside of the case 12. In other words, the inside air in the case 12 is ventilated. This improves the cooling efficiency of the first electronic part 32, the second electronic part 34, and the like.

Moreover, the outside air fd supplied from the lower ventilation openings 74 to the inside of the case 12 flows along the inner surface 52B of the external heat sink 50. This improves the heat dissipation efficiency of the external heat sink 50.

Note that at least one of the upper ventilation openings 72 and the lower ventilation openings 74 may be formed in the case 12.

[Third Embodiment]

Next, a third embodiment is described. In the third embodiment, members with the same configurations as those in the first and second embodiments are denoted by the same reference numerals and description thereof is omitted as appropriate.

Figure 7:
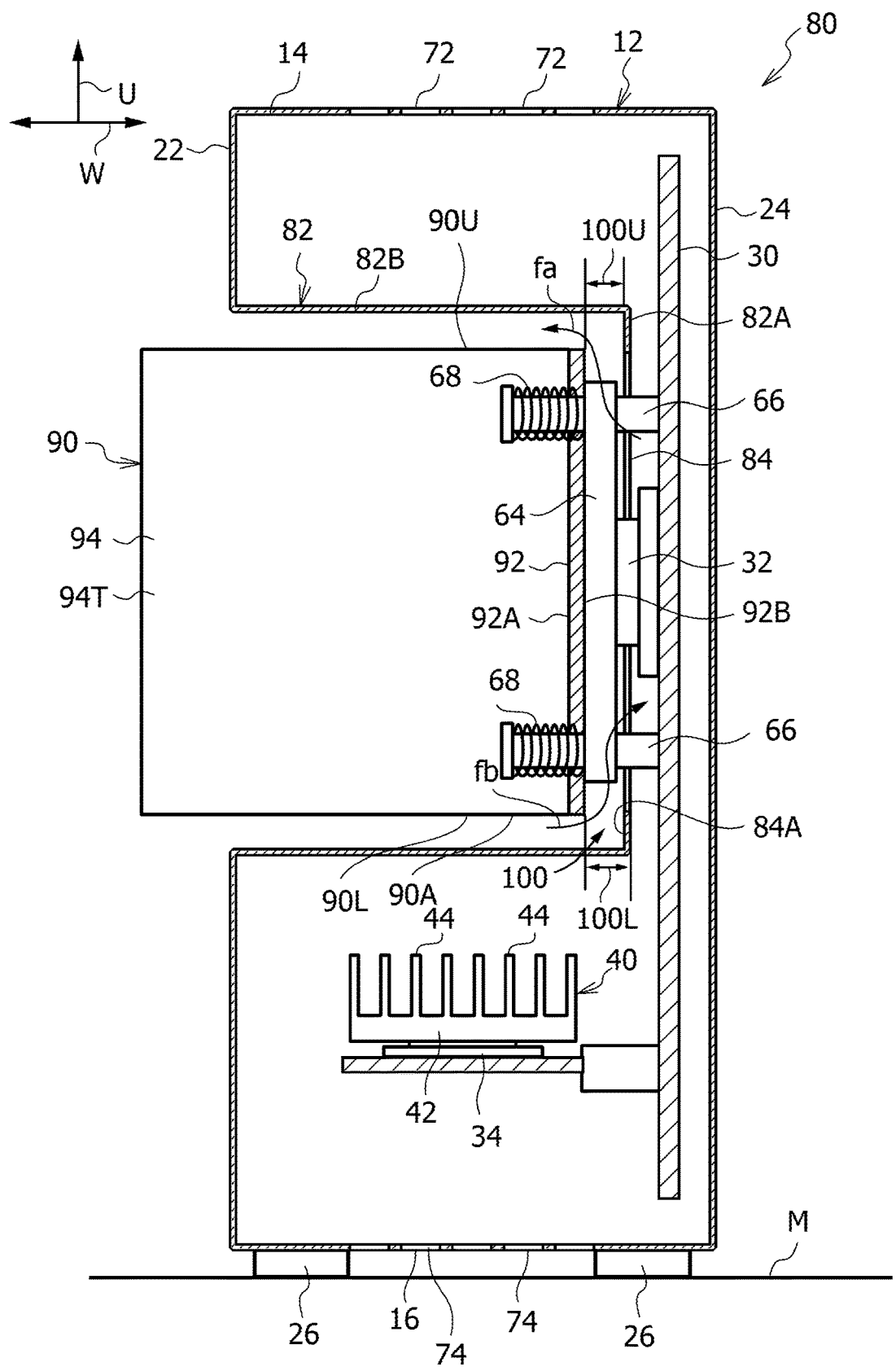
FIG. 7 is a cross-sectional view corresponding to FIG. 2 and illustrating an electronic apparatus according to a third embodiment.

As illustrated in FIG. 7, an electronic apparatus 80 according to the third embodiment includes the case 12. The side wall 22 of the case 12 has a recess portion 82 recessed toward the inside of the case 12. The recess portion 82 is formed in a rectangular shape when the case 12 is viewed from the side wall 22 side. An external heat sink 90 is housed in the recess portion 82.

The recess portion 82 includes a bottom wall 82A and a peripheral wall 82B. The bottom wall 82A faces the side wall 24 of the case 12. The bottom wall 82A forms part of the side wall 22 of the case 12. Moreover, an opening 84 is formed in the bottom wall 82A. The opening 84 is formed in, for example, a rectangular shape. The opening 84 faces the first electronic part 32. Moreover, the peripheral wall 82B is provided in an outer peripheral portion of the bottom wall 82A.

The peripheral wall 82B is formed in an annular shape along the outer peripheral portion of the bottom wall 82A. Moreover, the peripheral wall 82B extends from the outer peripheral portion of the bottom wall 82A in a direction away from the side wall 24 of the case 12. The external heat sink 90 is partially housed in the recess portion 82. The external heat sink 90 entirely covers the opening 84.

The external heat sink 90 is made of, for example, a metal material with high thermal conductivity such as aluminum or copper. The external heat sink 90 includes a base plate 92 and multiple heat dissipation fins 94. The base plate 92 is formed in a rectangular shape. The base plate 92 is connected to the first electronic part 32 via the spreader 64 to be capable of exchanging heat therewith.

The spreader 64 is housed in the recess portion 82. The spreader 64 and the base plate 92 are fixed to the circuit board 30 via the multiple supporting columns 66. The multiple supporting columns 66 extend from the outer peripheral portion of the spreader 64 and are fixed to the circuit board 30 through the opening 84. Moreover, the elastic bodies 68 are provided on the supporting columns 66. The spreader 64 is brought into pressure contact with the first electronic part 32 by the biasing force of the elastic bodies 68. Note that the elastic bodies 68 are housed in the recess portion 82.

The multiple heat dissipation fins 94 are provided on an outer surface 92A of the base plate 92. The multiple heat dissipation fins 94 extend from the base plate 92 in the direction away from the side wall 24. Distal end portions 94T of the respective heat dissipation fins 94 protrude out from the recess portion 82 and are arranged outside the side wall 22 of the case 12. In other words, the distal end portions 94T of the respective heat dissipation fins 94 are not housed in the recess portion 82.

Moreover, the multiple heat dissipation fins 94 extend in the height direction of the case 12. The heat of the first electronic part 32 is dissipated to the outside of the case 12 via the heat dissipation fins 94. The first electronic part 32 is thereby cooled.

Gaps 100 are formed between an outer peripheral portion 90A of the external heat sink 90 and an outer surrounding portion 84A of the opening 84 in the bottom wall 82A of the recess portion 82. The gaps 100 are formed in an annular shape over the entire outer peripheral portion of the external heat sink 90.

Note that, in the following description, the gap 100 along an upper end portion 90U of the external heat sink 90 is referred to as an upper gap 100U. Moreover, the gap 100 along a lower end portion 90L of the external heat sink 90 is referred to as a lower gap 100L. Furthermore, although illustration is omitted, the gaps 100 along left and right end portions of the external heat sink 90 are referred to as vertical gaps.

[Operations]

Next, operations of the third embodiment are described.

As illustrated in FIG. 7, in the electronic apparatus 80 according to the embodiment, the recess portion 82 is formed in the side wall 22 of the case 12. The external heat sink 90 is housed in the recess portion 82. Moreover, the opening 84 is formed in the bottom wall 82A of the recess portion 82. The gaps 100 are formed between the outer surrounding portion 84A of the opening 84 and the outer peripheral portion 90A of the external heat sink 90.

More specifically, the upper gap 100U is formed between the upper end portion 90U of the external heat sink 90 and the outer surrounding portion 84A of the opening 84. Moreover, the lower gap 100L is formed between the lower end portion 90L of the external heat sink 90 and the outer surrounding portion 84A of the opening 84. Furthermore, although illustration is omitted, the vertical gaps are formed between the left and right end portions of the external heat sink 90 and the outer surrounding portion 84A of the opening 84.

As a result, air flows as follows when the inside air in the case 12 is heated by the heat of the first electronic part 32, the second electronic part 34, and the like. Specifically, as illustrated in FIG. 7, the inside air fa in the case 12 rises and is exhausted from the opening 84 to the outside of the case 12 via the upper gap 100U. Moreover, the outside air fb outside the case 12 is supplied from the lower gap 100L to the inside of the case 12 via the opening 84. In other words, the inside air in the case 12 is ventilated. This improves the cooling efficiency of the first electronic part 32, the second electronic part 34, and the like. Note that, although illustration is omitted, the inside air in the case 12 is also ventilated via the vertical gaps.

Moreover, the outside air fb supplied from the lower gap 100L to the inside of the case 12 via the opening 84 flows along a portion of an inner surface 92B on the lower end portion 90L side of the external heat sink 90. This outside air fb improves the heat dissipation efficiency of the external heat sink 90. Specifically, the outside air fb flowing along the portion of the inner surface 92B on the lower end portion 90L side of the external heat sink 90 cools the external heat sink 90.

Furthermore, the outside air fb supplied from the lower gap 100L to the inside of the case 12 via the opening 84 directly cools the first electronic part 32. Accordingly, the cooling efficiency of the first electronic part 32 is further improved.

In addition, the inside air fa in the case 12 to be exhausted from the opening 84 to the outside of the case 12 via the upper gap 100U flows along a portion of the inner surface 92B on the upper end portion 90U side of the external heat sink 90. This inside air fa further improves the heat dissipation efficiency of the external heat sink 90.

As described above, the inside air in the case 12 is also ventilated via the vertical gaps. In this case, the inside air in the case 12 or the outside air outside the case 12 flows along portions of the inner surface 92B on the left and right end portion sides of the external heat sink 90. This inside air or the outside air improves the heat dissipation efficiency of the external heat sink 90.

Furthermore, the external heat sink 90 is partially housed in the recess portion 82. Hence, in the embodiment, it is possible to provide the external heat sink 90 closer to the first electronic part 32 than in the aforementioned first embodiment. Accordingly, it is possible to improve the transmission efficiency of heat between the external heat sink 90 and the first electronic part 32. As a result, it is possible to further improve the cooling efficiency of the first electronic part 32.

In the embodiment, it is possible to omit the heat pipe 62 (see FIG. 2) in the aforementioned first embodiment. Accordingly, it is possible to reduce the number of parts in the electronic apparatus 80.

Furthermore, part of the external heat sink 90 is housed in the recess portion 82. Hence, it is possible to reduce the protrusion amount of the distal end portions 94T of the heat dissipation fins 94 from the side wall 22 of the case 12. Accordingly, it is possible to reduce the installation space of the electronic apparatus 80.

Note that, although the external heat sink 90 is partially housed in the recess portion 82 in the embodiment, the entire external heat sink may be housed in the recess portion 82. In other words, the external heat sink 90 may be at least partially housed in the recess portion 82.

[Modified Examples]

Next, modified examples of the aforementioned first to third embodiments are described. Note that, although various modification examples are described by using the aforementioned first embodiment as an example in the following description, these modified examples may be applied to the aforementioned second and third embodiments as appropriate.

In the aforementioned first embodiment, the entire (whole) external heat sink 50 is arranged outside the case 12. However, for example, as illustrated in the modified example of FIG. 8, the external heat sink 50 may be partially arranged inside the case 12.

Figure 8:
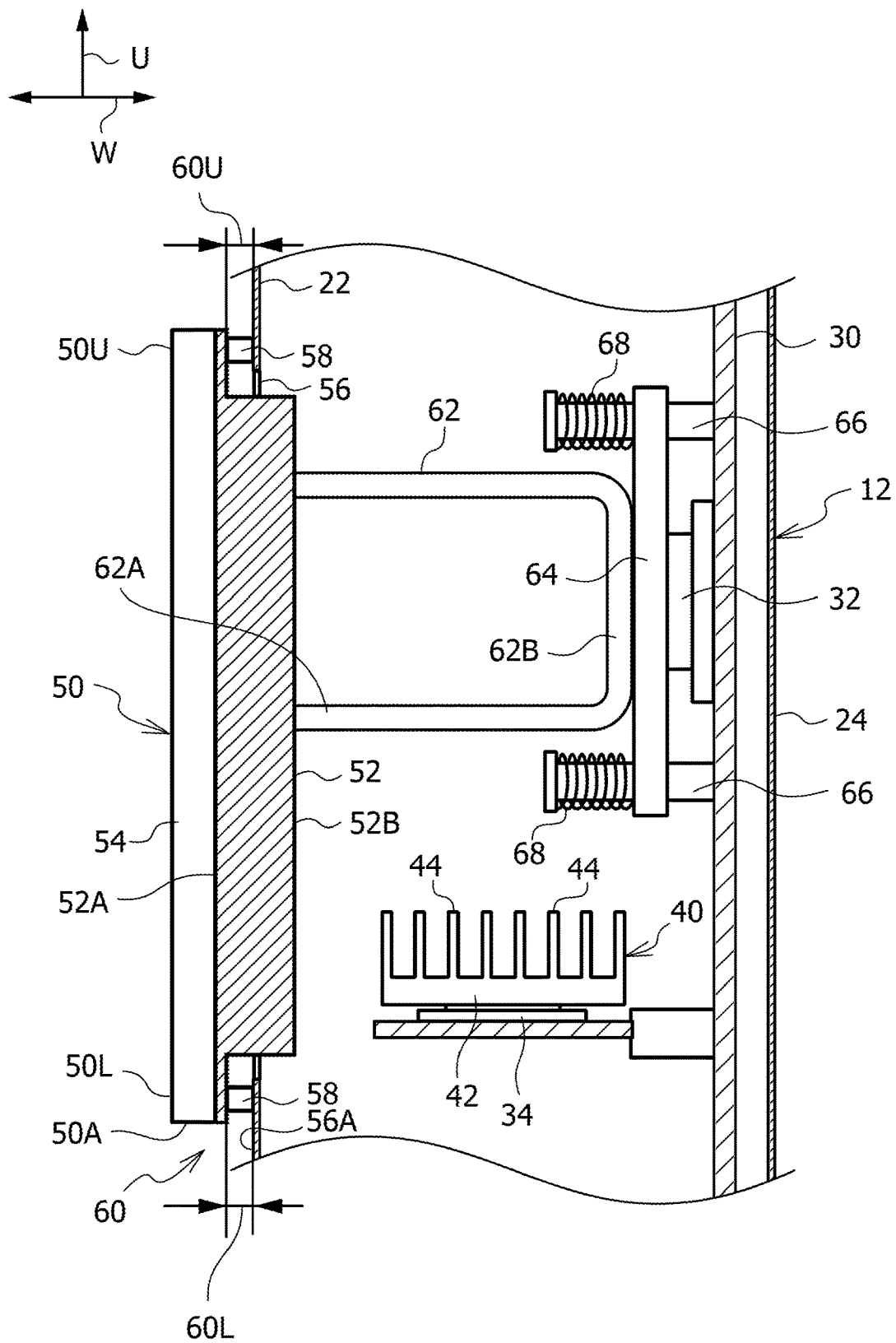
FIG. 8 is a cross-sectional view corresponding to FIG. 2 and illustrating a modified example of the electronic apparatus according to the first embodiment.

Specifically, in the modified example illustrated in FIG. 8, part of the base plate 52 of the external heat sink 50 is arranged inside the case 12 with the base plate 52 extending through the opening 56. Moreover, for example, in the modified example illustrated in FIG. 9, the entire base plate 92 of the external heat sink 90 and part of the heat dissipation fins 94 are arranged in the case 12 with the heat dissipation fins 94 extending through the opening 84.

Figure 9:
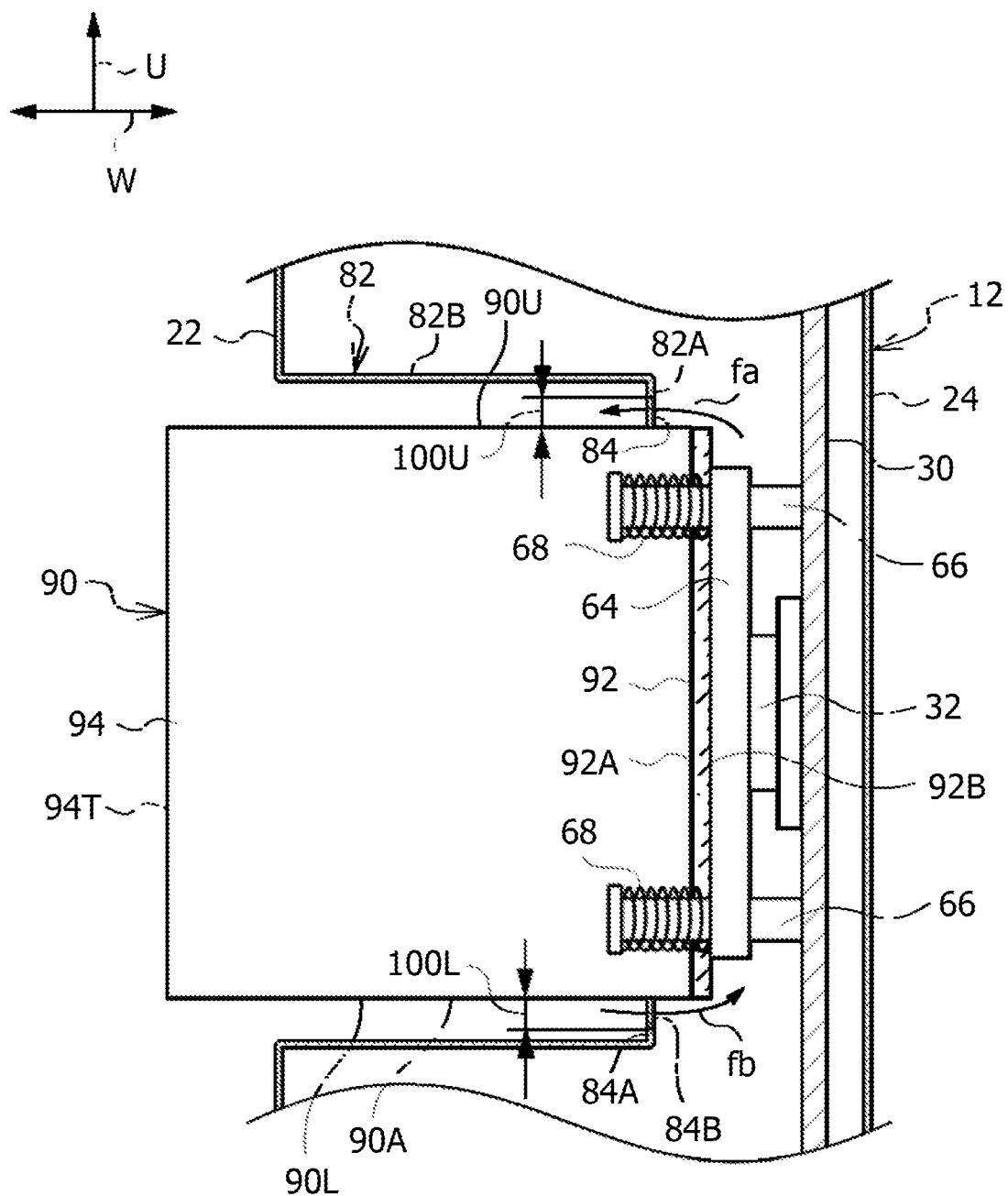
FIG. 9 is a cross-sectional view corresponding to FIG. 7 and illustrating a modified example of the electronic apparatus according to the third embodiment.

Note that, in the modified example illustrated in FIG. 9, the gaps 100 (upper gap 100U, lower gap 100L, vertical gaps) are formed between the outer peripheral portion 90A of the external heat sink 90 and the peripheral edge portion 84B of the opening 84. Moreover, in the modified example illustrated in FIG. 9, the opening 84 is partially covered with the external heat sink 90.

Moreover, although the gaps 60 are formed over the entire outer peripheral portion 50A of the external heat sink 50 in the aforementioned first embodiment, the gaps may be formed partially along the outer peripheral portion 50A of the external heat sink 50. Note that, in order to improve the ventilation efficiency of the inside air in the case 12, it is preferable to form gaps at least on the upper end portion 50U side and the lower end portion 50L side of the external heat sink 50.

Furthermore, although the heat dissipation fins 54 of the external heat sink 50 extend in the height direction of the case 12 in the aforementioned first embodiment, the heat dissipation fins of the external heat sink 50 may extend in, for example, the length direction of the case 12. Moreover, the structure of the external heat sink 50 may be changed as appropriate. Furthermore, the shape and size of the opening 56 may be changed as appropriate.

Moreover, although the external heat sink 50 is connected to the first electronic part 32 in the aforementioned first embodiment, the external heat sink 50 may be connected to multiple electronic parts. Furthermore, multiple external heat sinks may be provided on the case 12.

Furthermore, although the internal heat sink 40 is housed in the case 12 in the aforementioned first embodiment, the internal heat sink 40 may be omitted as appropriate.

Moreover, although the external heat sink 50 is connected to the first electronic part 32 via the heat pipe 62 in the aforementioned first embodiment, the external heat sink 50 may be connected to the first electronic part via other thermally-conductive members.

Furthermore, although the external heat sink 50 is fixed to the side wall 22 of the case 12 via the spacer members 58 in the aforementioned first embodiment, the fixation structure of the external heat sink 50 to the case 12 may be changed as appropriate.

Moreover, although the external heat sink 50 is arranged outside the side wall 22 of the case 12 in the aforementioned first embodiment, the external heat sink may be arranged on the side wall 24 of the case 12. Alternatively, the external heat sink may be arranged outside the front wall 18 or the rear wall 20 of the case 12. In this case, the front wall 18 or the rear wall 20 of the case 12 is an example of the side wall of the case.

Furthermore, although the external heat sink 50 is connected to the first electronic part 32 mounted on the circuit board 30 in the aforementioned first embodiment, the external heat sink 50 may connected not only to electronic parts mounted on the circuit board but also to various electronic parts which generate heat.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
   a case that includes a side wall having an opening;
   an electronic part housed in the case; and
   a heat sink coupled to the electronic part and includes a bottom surface facing the electronic part, the heatsink is at least partially arranged outside of the side wall of the case with a gap formed between the bottom surface of the heat sink and the side wall of the case,
   an outside air outside the heat sink is supplied from the gap into the case via the opening, and
   an inside air inside the case is exhausted from the opening to outside of the case through the gap.

2. The electronic apparatus according to claim 1, wherein the gap is formed at least between each of upper and lower end portions of the heat sink and the side wall of the case.

3. The electronic apparatus according to claim 2, wherein the gap is formed between each of left and right end portions of the heat sink and the side wall of the case.

4. The electronic apparatus according to claim 1, wherein the heat sink covers the opening.

5. The electronic apparatus according to claim 4, wherein the gap is formed between an outer peripheral portion of the heat sink and an outer surrounding portion of the opening.

6. The electronic apparatus according to claim 5, further comprising a spacer member arranged between the side wall of the case and the heat sink to form the gap.

7. The electronic apparatus according to claim 6, wherein the heat sink is coupled to the side wall of the case via the spacer member.

8. The electronic apparatus according to claim 4, wherein the side wall of the case has a recess portion, and the heat sink is at least partially arranged in the recess portion.

9. The electronic apparatus according to claim 8, wherein the opening is formed in a bottom wall of the recess portion.

10. The electronic apparatus according to claim 1, wherein a lower wall of the case includes a lower ventilation opening.

11. The electronic apparatus according to claim 10, wherein the lower wall of the case includes a plurality of legs designed to be mounted on a mounting surface.

12. The electronic apparatus according to claim 1, wherein an upper wall of the case includes an upper ventilation opening.

13. The electronic apparatus according to claim 1, further comprising a thermally conductive member coupling the electronic part and the heat sink to each other.

14. The electronic apparatus according to claim 13, wherein the thermally conductive member includes a heat pipe.

15. The electronic apparatus according to claim 1, wherein the heat sink includes a plurality of heat dissipation fins extending in a height direction of the case and at least partially arranged outside the case.

16. The electronic apparatus according to claim 1, wherein the heat sink is a natural air-cooled heat sink.

17. The electronic apparatus according to claim 1, further comprising an internal heat sink housed in the case and coupled to another electronic part which is different from the electronic part and is housed in the case, the internal heat sink being configured to exchange heat with the another electronic part.

18. The electronic apparatus according to claim 1, further comprising a circuit board housed in the case, wherein the electronic part is mounted on the circuit board.

19. The electronic apparatus according to claim 18, wherein the bottom surface of the heat sink is arranged parallel to the circuit board.

* * * * *